(12) United States Patent
Chakraborty et al.

(10) Patent No.: US 7,482,831 B2
(45) Date of Patent: Jan. 27, 2009

(54) SOFT ERROR TOLERANT FLIP FLOPS

(75) Inventors: Tapan Jyoti Chakraborty, West Windsor, NJ (US); Aditya Jagirdar, Highland Park, NJ (US); Roystein Oliveira, Highland Park, NJ (US)

(73) Assignees: Alcatel-Lucent USA Inc., Murray Hill, NJ (US); Rutgers, The State University of New Jersey, New Brunswick, NJ (US)

( * ) Notice: Subject to any disclaimer, the term of this patent is extended or adjusted under 35 U.S.C. 154(b) by 51 days.

(21) Appl. No.: 11/431,802

(22) Filed: May 10, 2006

(65) Prior Publication Data

US 2007/0262787 A1    Nov. 15, 2007

(51) Int. Cl.
*H03K 19/003* (2006.01)
(52) U.S. Cl. .......................................... 326/12; 326/11
(58) Field of Classification Search .................. 326/12, 326/11, 14, 16; 327/202
See application file for complete search history.

(56) References Cited

U.S. PATENT DOCUMENTS 6,127,864 A * 10/2000 Mavis et al. ................. 327/144
6,326,809 B1   12/2001 Gambles et al.
6,975,238 B2   12/2005 Schneider

OTHER PUBLICATIONS

H. H. K. Tang, "Nuclear Physics of Cosmic Ray Interaction With Semiconductor Materials: Particle-Induced Soft Errors From a Physicist's Perspective," IBM J. Res. Develop., Vol. 40, No. 1, Jan. 1996, pp. 91-108.
J. F. Ziegler, "Terrestrial Cosmic Rays,", IBM J. Res. Develop., Vol. 40, No. 1, Jan. 1996, pp. 19-39.
J. F. Ziegler, "IBM Experiments in Soft Fails in Computer Electronics (1978-1994)," IBM J. Res. Develop., Vol. 40, No. 1, Jan. 1996, pp. 3-18.
Y. Arima et al., "Cosmic-Ray Immune Latch Circuit for 90nm Technology and Beyond,", 2004 IEEE International Solid-State Circuits Conference, Feb. 15-19, 2004, Digest of Technical Papers, OSSCC, pp. 492-493, Vol. 1.
R. Wilson, D. Lammers, "Soft Errors BEcome Hard Truth For Logic" EE Times, May 3, 2004. www.eetimes.cornsemi/news/showArticle.jhtml?articleID=19400052.
Bobert Baumann, "The Impact of Technology Scaling on Soft Error Rate Performance and Limits to the Efficacy of Error Correction," In International Electron Devices Meeting (IEDM), pp. 329-332, 2002.
M. Nicolaidis, "Time Redundancy Based Soft-Error Tolerance to Rescue Nanometer Technologies," VLSI Test Symposium, 1999. Proceedings, 17th IEEE.

(Continued)

*Primary Examiner*—Rexford Barnie
*Assistant Examiner*—Thienvu V Tran

(57) ABSTRACT

A register designed to detect and correct soft errors in real time. A redundant latch is added to the existing structure of a flip flop and functional data is simultaneously registered at multiple latches. The content of these multiple latches are fed to a majority voting circuit. If the content of any of these latches is corrupted by soft error, it is filtered out through the majority voting circuit and correct data is passed out from the output of the flip flop. In one embodiment, this design operates as a simple scan flip flop or scan-hold flip flop, and is useful for system testability purposes.

14 Claims, 9 Drawing Sheets

OTHER PUBLICATIONS

D. G. Mavis and P. H. Eaton, "Soft Error Rate Mitigation Techniques for Modern Microcircuits," International Reliability Physics Symp., 2002.

S. Mitra et al., "Robust System Design with Built-In Soft-Error Resilience," IEEE Computer, Vol. 38, No. 2, pp. 43-52, Feb. 2005.

S. Dasgupta et al., "An Enhancement to LSSD and Some Applications of LSSD in Reliability, Availability, and Serviceability," Proc. International Symp. on Fault Tolerant Computing, June, 1981, Maine, USA.

M. L. Bushnell and V.D. Agrawal, "Essentials of Electronic Testing for Digital, Memory and Mixed-Signal VLSI Circuits," 3rd printing, no date.

Alan J. Drake et al., "A Self-Correcting Soft Error Tolerant Flop-Flop," 12th NASA Symp. on VLSI Design, Coeur d'Alene, Idaho, USA, Oct. 4-5, 2005.

P. S. Bottorff et al., "Test Generation for Large Logic Networks," in Proc. of the 14th Design Automation Conf., Jun. 1977, pp. 479-485.

P. K. Lala, "Self-Checking and Fault-Tolerant Digital Design," Morgan Kaufmann Publishers, ISBN0-12-434370-8, pp. 162-165, no date.

* cited by examiner

200

800

900

SOFT ERROR TOLERANT FLIP FLOPS

FIELD OF THE INVENTION

The invention relates to the field of integrated circuits and, more specifically, to soft error tolerant flip flops in digital circuits.

BACKGROUND OF THE INVENTION

Radiation from outer space containing charged particles can affect transistors in an integrated circuit (IC) resulting in a change in the state of transistors. This is called "Soft Error" or Single Event Upset (SEU). This type of error creates a temporary transient effect that corrupts logic within the IC. With the progress of microelectronics technology, the reduction in size of transistors allows for the integration of more transistors operating at lower threshold voltages within one IC. This makes the IC more vulnerable to soft errors.

SEU or soft error is a condition which may arise in the IC or system (chip) when it is exposed to high energy radiation (i.e., cosmic rays, alpha particles, neutrons etc.). This error manifests itself in the form of a change in state of a system from the normal expected state (e.g., change in the expected output of a combinational gate or a change of content of a state element from a 1 to 0 or vice versa). This may affect the outcome of the operation of the system. The effect of the error is temporary and if detected, the system can be restored to its normal operation by resetting the system or, if possible, by re-executing the system task. The error though temporary in nature, is of concern in mission critical operations (i.e., space, medical) where a downtime or delay for system recovery can be destructive.

When exposed to radiation, the devices on the chip are under constant bombardment by particles such as neutrons and alpha particles. When a high energy particle strikes a node in these devices, it generates electron hole pairs. Under the presence of a strong electric field, these charged carriers move toward their respective device contacts. If the collected charge is greater than the threshold value required for determining a logic level of a transistor, an erroneous value is registered. This minimum threshold value required to determine the logic level is also known as critical charge.

SUMMARY OF THE INVENTION

Various deficiencies in the prior art are addressed through the invention of a method and apparatus for soft error tolerant flip flops. In one embodiment, the present invention provides for a register including a scan flip flop having a scan portion and a system flip flop. The register also includes a hold flip flop having a hold master flip flop and a hold slave flip flop and a majority voter that receives three data signals that is transmitted from the scan portion, the system flip flop and the hold flip flop, whereby a correct data signal is generated. In another embodiment, the present invention provides for a method for detecting and correcting soft error, the method includes the steps of storing a first replica data value in a scan portion of a basic scan flip flop; storing a second replica data value in a system flip flop; storing a third replica data value in a hold flip flop; and comparing the three replica data values, thereby generating the correct output even if one of the data signals is corrupted.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The present invention is discussed in the context of an integrated circuit architecture comprising of a plurality of registers; however, the present invention can be readily applied to other circuit architectures. In general, the present invention enables the detection and correction operations to take place in real time, with a small degradation in system operating speed. In one embodiment, the present invention uses redundant latches, and functional data is simultaneously registered at multiple latches. The content of these multiple latches are fed to a majority voting circuit. The correct data is passed out from the majority voting circuit.

Figure 1:
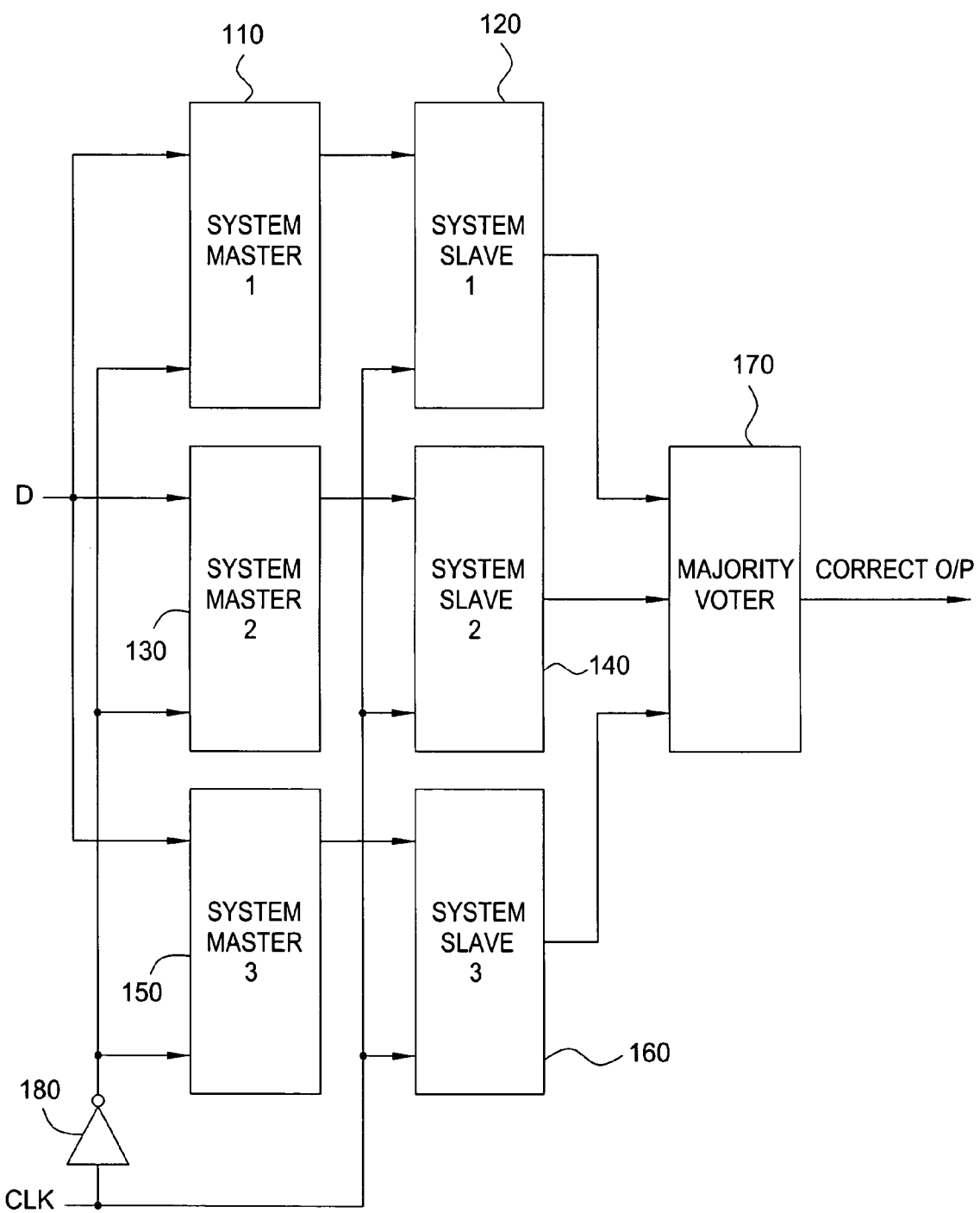
FIG. 1 depicts a high-level block diagram of a triple modular redundancy scheme (TMR) architecture according to one embodiment of the invention.

FIG. 1 depicts a high-level block diagram of a triple modular redundancy scheme (TMR) architecture according to one embodiment of the invention. The Single Event Upset (SEU) tolerant flip flops is based on the triple modular redundancy scheme (TMR). In the TMR, three replicas of the system latches are used and the outputs of the three slave system latches are passed onto the majority voter which generates the correct output from the flip flop assuming that only one error occurs at a time.

In one embodiment, the TMR includes three sets of system master and system slaves, 110, 120, 130, 140, 150 and 160, and a majority voter 170. The TMR also includes an inverter 180 to invert the clock signal going into the system master circuits, 110, 130 and 150.

System master 1 110 receives an input signal D and an inverted clock signal. The system master 1 110 transmits an output signal to system slave 1 120. The system slave 1 receives that signal and a clock signal and transmits its output signal to the majority voter 170.

System master 2 130 also receives an input signal D and an inverted clock signal and transmits an output signal to the system slave 2 140. The system slave 2 receives the output signal and the clock signal and also transmits its output signal to the majority voter 170.

System master 3 150 receives an input signal D and an inverted clock signal and transmits an output signal to system slave 3 160. The system slave 3 receives the output signal and the clock signal and also transmits its signal to the majority voter 170.

The majority voter 170 receives the three signals from the system slaves 120, 140 and 160. The value that is represented by at least two of those signals is determined to be the correct output. This design is based on the assumption that at most only one of the system master/system slave pair is affected by soft error.

Figure 2:
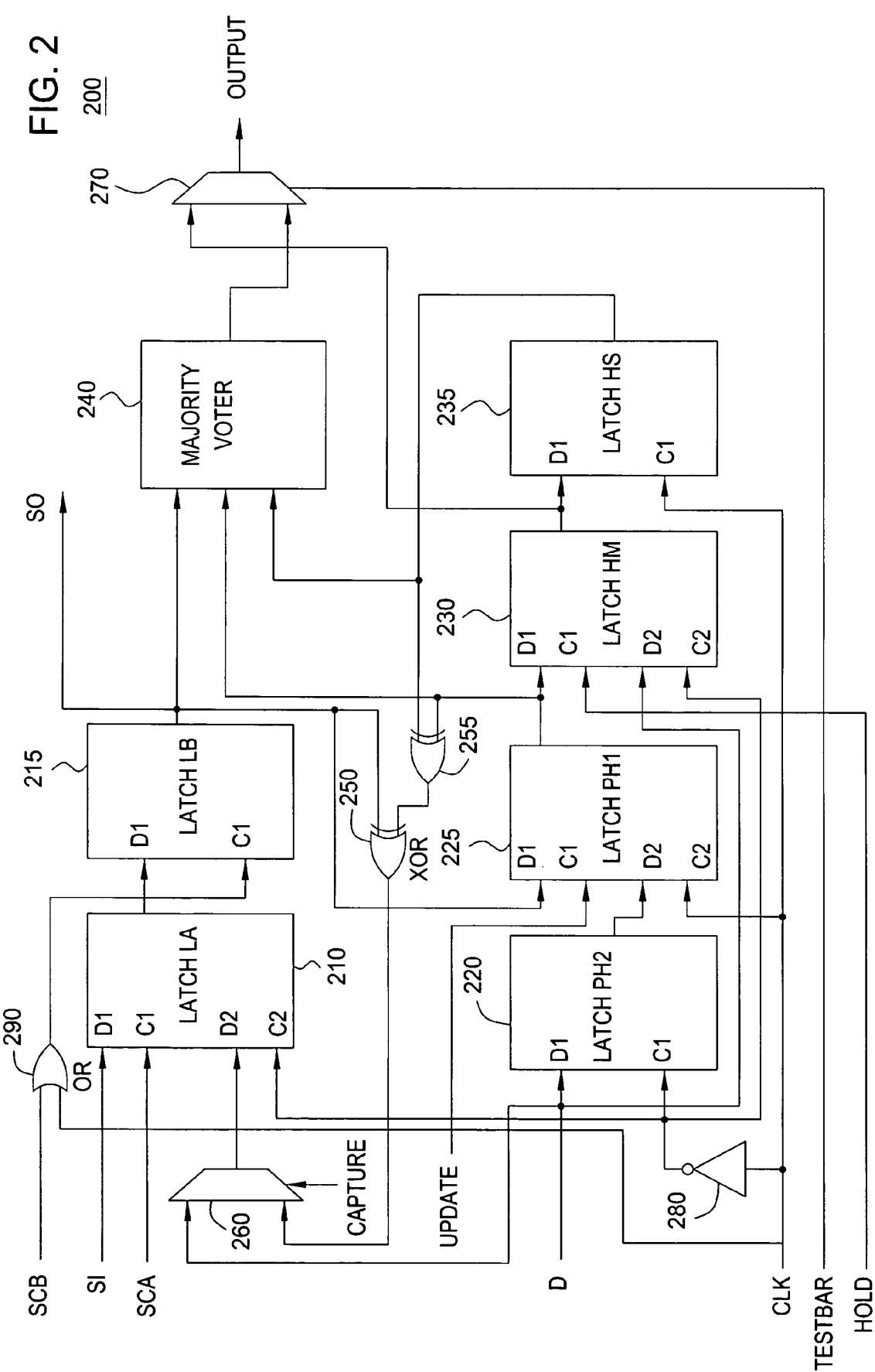
FIG. 2 depicts a high-level block diagram of a soft error tolerant flip flop architecture according to one embodiment of the invention.

FIG. 2 depicts a high-level block diagram of a soft error tolerant flip flop architecture according to one embodiment of the invention. In one embodiment, the architecture includes a design having a redundant scan hardware and require an overhead of just two latches as compared to four in the TMR scheme of FIG. 1. In another embodiment, the overhead is further reduced to one latch by making use of the scan hold flip flop architecture. Thus, the flip flop structure 200 is suitable for basic scan based testing for structural faults, delay testing with enhanced scan structure, and functional mode operation with tolerance to soft errors in real time.

The flip flop architecture 200 includes a scan portion having a Latch LA 210 and a Latch LB 215, a system flip flop having a Latch PH2 220 and a Latch PH1 225, a Latch HM 230, a Latch HS 235, a majority voter 240, two XOR gates 250, 255, two multiplexers 260, 270, a inverter 280 and an OR gate 290.

The Latch LA 210 receives signal SI, a clock SCA, a signal from the multiplexer 260 and an inverse clock signal from the inverter 280. The Latch LA 210 provides an output signal to Latch LB 215.

Latch LB 215 receives the output signal from Latch LA and a clock signal CLK from the OR gate 290. Latch LB 215 transmits a signal SO that is also sent to the majority voter 240, Latch PH1 and XOR gate 250.

The Latch PH2 220 receives a signal D and the inverse CLK from the inverter 280. The Latch PH2 transmits its output signal to Latch PH1 225.

The Latch PH1 225 receives a signal that is from the Latch LB 215 and the output signal from Latch PH2 220. Latch PH1 225 also receives signals UPDATE and CLK. The Latch PH1 225 has one output signal that is sent to Latch HM 230, XOR gate 255 and the majority voter 240.

The Latch HM 230 receives the output signal of Latch PH1 225, a signal HOLD, the input signal D, and the inverse CLK signal. The Latch HM 230 transmits its output signal to the Latch HS 235 and the multiplexer 270.

The Latch HS 235 receives the output signal from Latch HM 230 and the clock signal CLK. It transmits its output signal to the majority voter 240 and XOR 255.

The XOR gate 255 receives the output signal of Latch HS 235 and Latch PH1 and outputs to XOR gate 250.

The XOR gate 250 receives the output signal of XOR gate 255 and Latch LB 215. The XOR gate 250 transmits its output signal to multiplexer 260.

The multiplexer 260 receives the input signal D and the output signal from XOR gate 250. The multiplexer 260 is enabled by a signal CAPTURE. The multiplexer 260 sends its output signal to Latch LA 210.

The majority voter 240 receives the output signals from Latch LB 215, Latch PH1 225 and Latch HS 235. It sends an output signal that represents the majority value of the input to the multiplexer 270.

The multiplexer 270 receives the output signal from the majority voter 240 and the output signal of Latch HM 230. It is enabled by a signal TESTBAR. The multiplexer 270 outputs a signal OUTPUT.

The OR gate 290 receives a clock signal SCB and the clock signal CLK. The OR gate 290 transmits its output signal to the Latch LB 215.

The inverter 280 receives the CLK signal and sends the inverted CLK to Latch PH2 220, Latch HM 230, and Latch LA 210.

Figure 3:
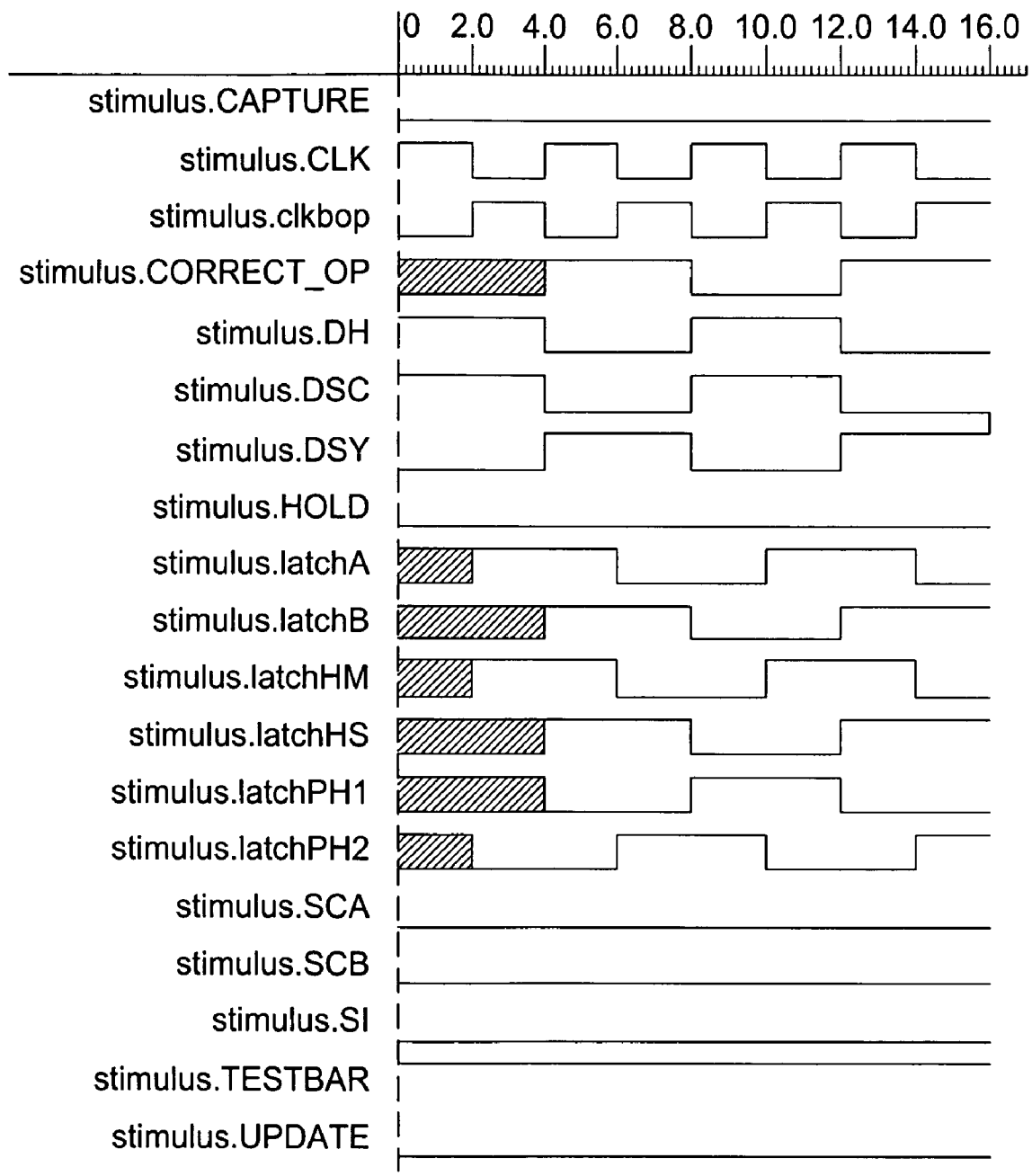
FIG. 3 illustrates a graph of the logic states during a functional mode simulation according to one embodiment of the invention.

FIG. 3 illustrates a graph of the logic states during a functional mode simulation according to one embodiment of the invention. In this mode, the signals SI, SCA, SCB, UPDATE, CAPTURE, and HOLD are all held low and TESTBAR is asserted. The latches LA, PH2, HM have data input as D (i.e., CAPTURE=0) and clocked by inverted CLK. The output of latch LA is the data input of latch LB clocked by CLK. The output of the latch LB, PH1 and HS are the inputs to the majority voter.

The output of the majority voter is the input to the multiplexer, which is also the output of the flip flop in this mode (i.e., TESTBAR=1). The data input is latched into the latches LA, PH2 and HM when CLK is low. The content of the three master latches is then loaded into the slave latches LB, PH1 and HS when CLK is high. The data that is stored into the slave latches is applied to the majority voter and the output is the correct output. In the next clock cycle, the new data is loaded and the sequence continues.

In FIG. 3, signals Hold Data (DH), Scan Data (DSC) and System Data (DSY) are the data inputs to the three master latches HM, LA and PH2 respectively (i.e., D in the block diagrams of FIG. 1 and FIG. 2). The data in the system latches is opposite to the data in the scan and hold latches but the circuit still registers the correct output.

Figure 4:
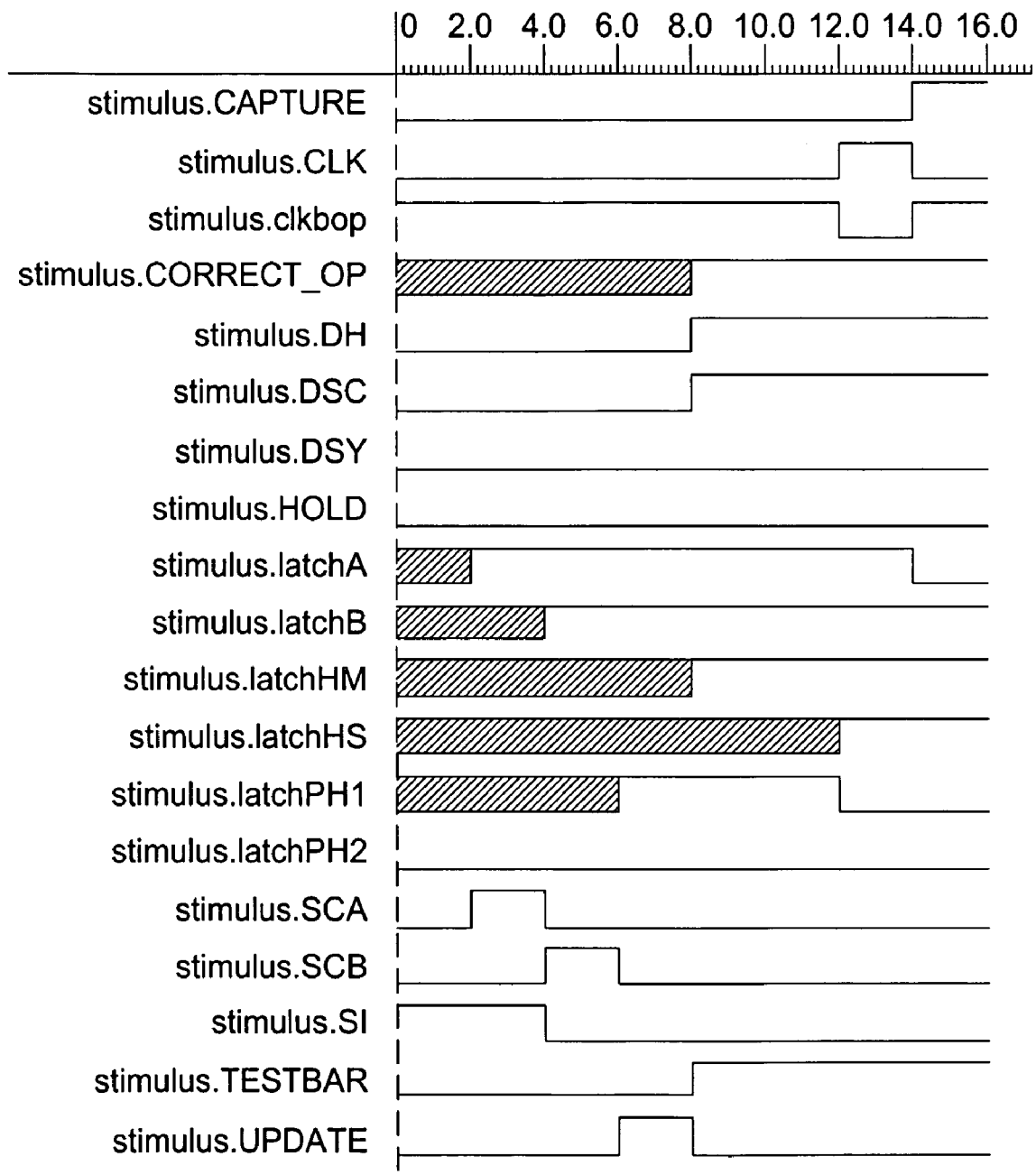
FIG. 4 illustrates a graph of the logic states during normal test mode simulation according to one embodiment of the invention.

FIG. 4 illustrates a graph of the logic states during normal test mode simulation according to one embodiment of the invention. When the scan master clock SCA is asserted, scan data SI is latched into LA. SCA is then made low and slave clock SCB is asserted, causing the data from LA to be latched into LB. UPDATE signal is then asserted which causes the data from LB to get latched into PH1 (i.e., TESTBAR=0). The UPDATE signal is then made low and PH1 holds onto its latched data. The vector that is scanned is then applied to the circuit under test (CUT) by asserting the TESTBAR signal (i.e., functional mode). This selects the output of the majority voter through the output multiplexer (LB and PH1 have the vector to be applied and the value stored in HS doesn't matter). The response of the CUT to the applied vector is captured into the latches LA, PH2 and HM (i.e., functional mode) and is shifted to the slave latches at the completion of the cycle. The output of PH1 and HS are also fed to a XOR gate that helps detect stuck at faults in the system and hold latch paths (i.e., The output of the XOR is 1 if there is a stuck at fault and 0 if there is not stuck at fault. The scan latches have already been checked for their functionality by a SCAN FLUSH test). The output of this XOR gate is then XORed with the output of LB. In one embodiment, the output of LB is chosen instead of being determined by the majority voter as the scan latches is verified by the FLUSH test. In one embodiment, it is assumed that no SEU's occur during testing. If there is a stuck at fault in any of the system or the hold latches, the complement of the output of LB is stored in LA else it registers the correct output of the CUT for the applied input vector. This value is latched by asserting the CAPTURE signal. The resulting vector in LA can then be scanned out through SO by the alternate clocking of SCB and SCA in test mode. FIG. 4 shows a stuck at fault at the system latch (i.e., DSY=0). The signals DSC and DH go high when TESTBAR is asserted indicating a vector of logic 1 as the output of the CUT. As per the behavior of the system, when CAPTURE is asserted, the complement of the data in the scan latch LB is latched into LA.

Figure 5:
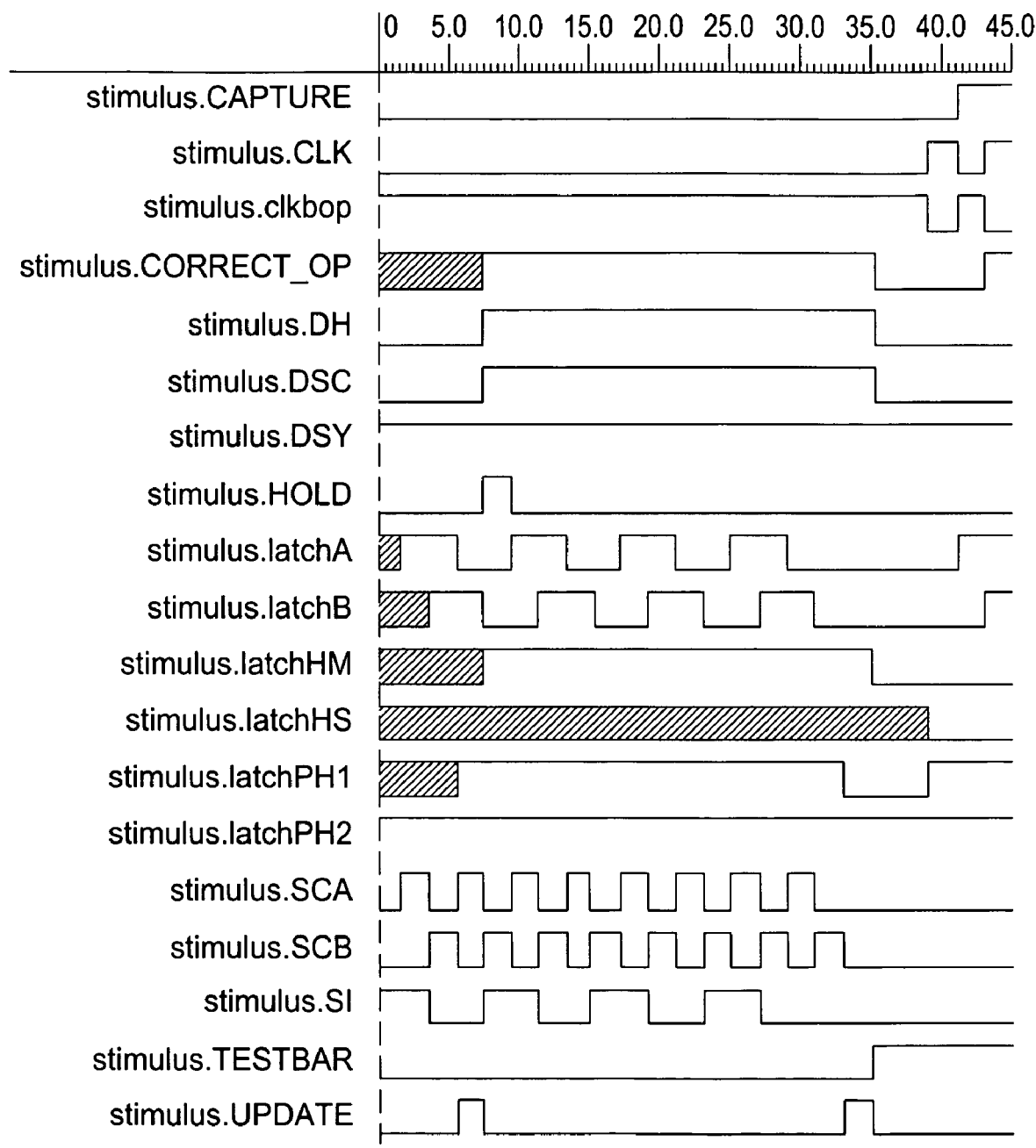
FIG. 5 illustrates a graph of the logic states during a delay test simulation according to one embodiment of the invention.

FIG. 5 illustrates a graph of the logic states during a delay test simulation according to one embodiment of the invention. The alternate assertion of SCA and SCB causes the first vector to be latched into the latch LA and LB respectively. When UPDATE is asserted for the first time, it causes the contents of the LB to be latched into PH1. UPDATE is then turned low. HOLD signal is then asserted and the contents of PH1 are latched into HM. Thus the first vector is applied to the CUT (i.e., TESTBAR=0). After HM is loaded with the first vector, HOLD is made low so that the CUT is isolated as the next vector is being loaded in. In the meantime, the second vector is loaded into LA and LB by the alternate assertion of SCA and SCB. Once the next vector to be applied is loaded into LB, UPDATE is once again asserted and the contents of LB are latched into PH1. This is the second vector and is now ready to be applied to the to the circuit undergoing delay test. The TESTBAR signal is asserted and the system is put into the functional mode driven by the system clock. The input to the CUT (i.e., second vector) is the output of the majority voter, which is the correct second vector as LB and PH1 have the same contents, which registers a correct value at the output of the voter. The working of the circuit is then identical to the normal test mode after switching into functional mode. As shown in the simulation plot in FIG. 5, the data on the DSY is held high throughout to simulate a stuck at one. Latch LA 210 registers the complement of DSC as DSY and DH do not match when TESTBAR=1 indicating a stuck at 1 in either system or hold latch. In one embodiment, instead of XORing the output of the latches to check for stuck at faults, the scan latches is used as a reference during comparison because the latches always contain the correct value of data (i.e., during test mode of operation only). The equivalent logic for the scheme is obtained from the truth table shown in Table 1.

Figure 6:
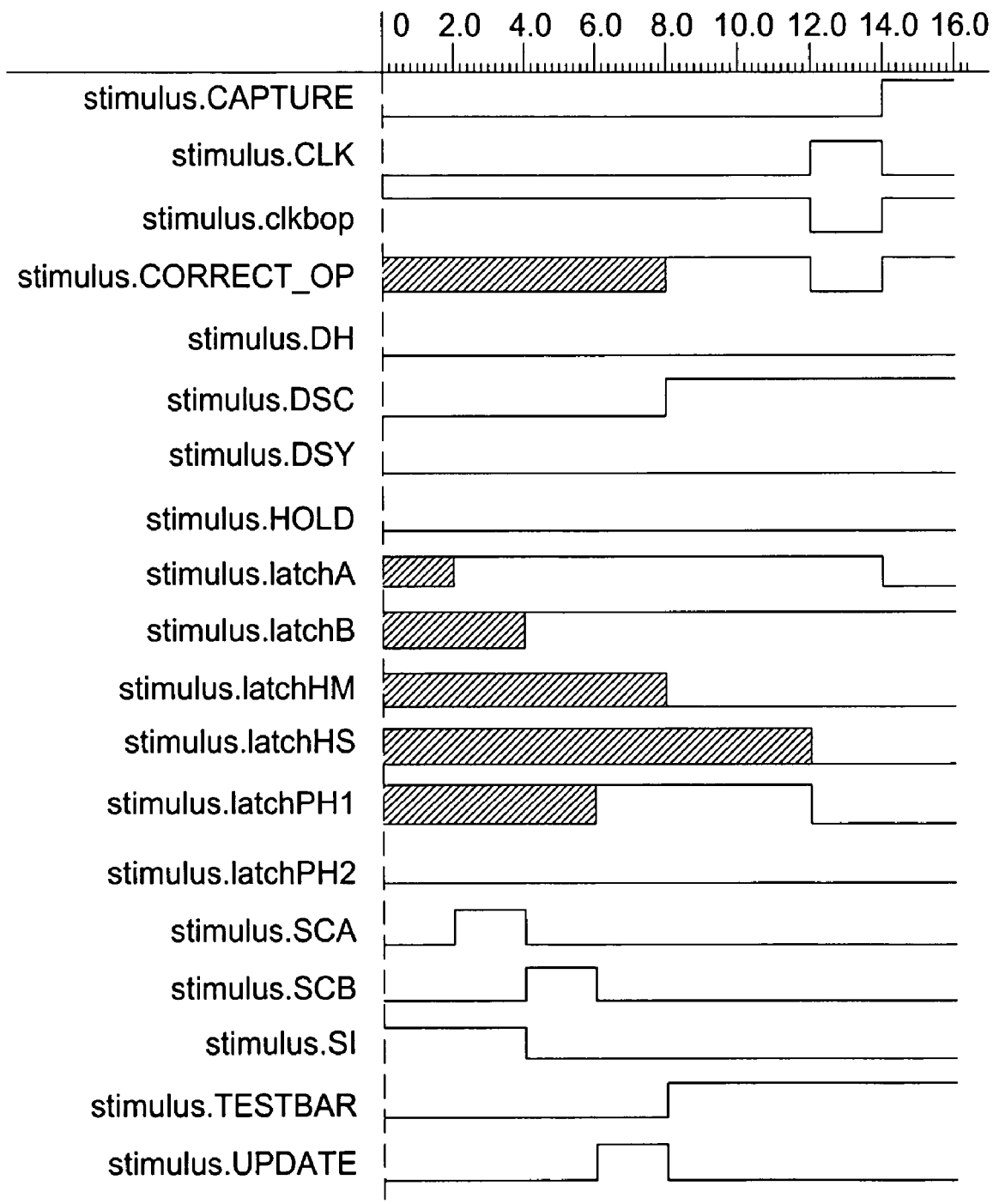
FIG. 6 illustrates a graph of the logic states during a test mode simulation for an alternate scheme according to one embodiment of the invention.
Figure 7:
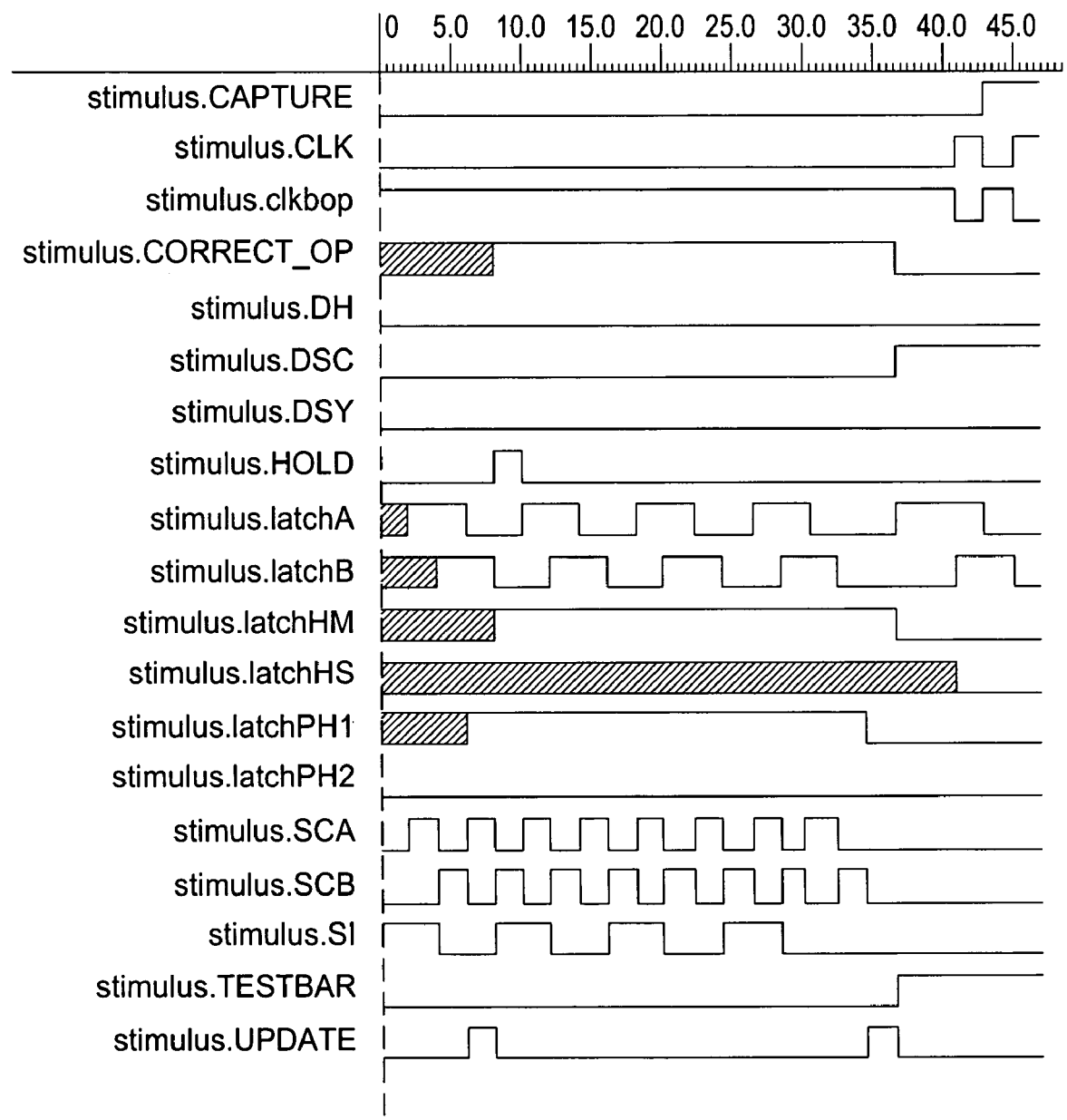
FIG. 7 illustrates a graph of the logic states during a delay test simulation for an alternate scheme according to one embodiment of the invention.

Alternate Scheme:

FIG. 6 illustrates a graph of the logic states during a test mode simulation for an alternate scheme according to one embodiment of the invention. FIG. 7 illustrates a graph of the logic states during a delay test simulation for an alternate scheme according to one embodiment of the invention. In one embodiment, instead of XORing the output of the latches to check for stuck at faults, advantage can be taken of the fact that the scan latches will always contain the correct value of data (i.e., during test mode of operation only). The equivalent logic for the scheme is obtained from the truth table shown in Table 1.

TABLE 1

Truth table for alternate scheme.

| System slave o/p | Hold slave o/p | Scan slave o/p | Output from the combinational circuit |
|---|---|---|---|
| 0 | 0 | 0 | 0 (all good) |
| 0 | 0 | 1 | 0 (both stuck at 0) |
| 0 | 1 | 0 | 1 (hold stuck at 1) |

TABLE 1-continued

Truth table for alternate scheme.

| System slave o/p | Hold slave o/p | Scan slave o/p | Output from the combinational circuit |
|---|---|---|---|
| 0 | 1 | 1 | 0 (system stuck at 0) |
| 1 | 0 | 0 | 1 (system stuck at 1) |
| 1 | 0 | 1 | 0 (hold stuck at 0) |
| 1 | 1 | 0 | 1 (both stuck at 1) |
| 1 | 1 | 1 | 1 (all good) |

This results in the combinational circuit defined by the function:

$$Input(LA) = (HS \& \overline{LB}) | (HS \& PH1) | (PH1 \& \overline{LB})$$

The scheme is guaranteed to identify single stuck faults occurring simultaneously in the system and hold paths. The simulation waveforms are as shown in the FIGS. 6 and 7. The data through the hold and system latches is kept low to simulate a stuck at zero effect. The data on DSC is the output of the applied vector to the prior CUT and is the correct vector. The value latched into LA after assertion of the CAPTURE signal is the complement of the data in the scan latch LB. Besides a combination of the above schemes along with the addition of more combinational circuitry, the circuit performance can be enhanced by avoiding the majority voter during absence of an error. Thus, performance degradation can be tolerated only when there is a need for correction.

Figure 8:
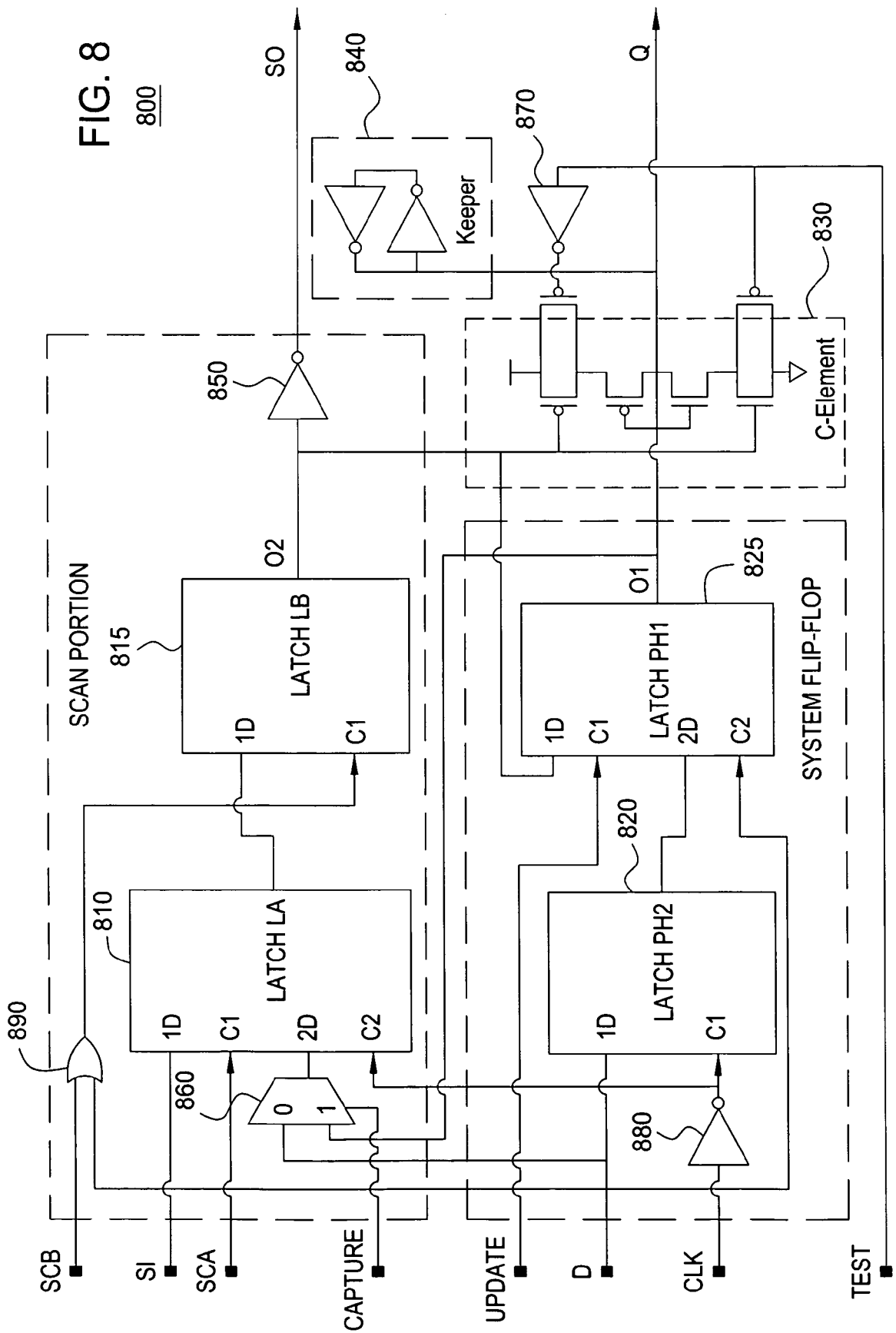
FIG. 8 depicts high-level block diagram of an error blocking flip flop according to one embodiment of the invention.

FIG. 8 depicts high-level block diagram of an error blocking flip flop according to one embodiment of the invention. The system latches are tested. The scheme is similar to the Test mode in the basic scan flip flop.

The flip flop architecture 800 includes a Latch LA 810, a Latch LB 815, a Latch PH2 820, a Latch PH1 825, a C element 830, a keeper 840, three inverters 850, 870, 880, a multiplexers 860 and an OR gate 890.

The Latch LA 810 receives signal SI, a clock SCA, a signal from the multiplexer 860 and an inverse clock signal CLK from the inverter 880. The Latch LA 810 transmits its output signal to Latch LB 815.

Latch LB 815 receives the output signal from Latch LA 810 and a clock signal from the OR gate 890. Latch LB 815 transmits its output signal to the inverter 850. Its output signal is also sent to the C element 830, and Latch PH1 825.

The Latch PH2 820 receives a signal D and the inverse CLK from the inverter 880. The Latch PH2 transmits its output signal to Latch PH1 825.

The Latch PH1 825 receives a signal that is the output of Latch LB 815 and a signal that is the output of Latch PH2 820. Latch PH1 225 also receives a signal UPDATE and CLK. The Latch PH1 825 has one output signal that is sent to the C element 830, and the multiplexer 860.

The C element 830 receives the output signal of Latch PH1 825, output signal of Latch LB 815, signal TEST and inverted TEST signal from inverter 870. The C element 830 is connected to the Keeper 840 and to output Q.

The Keeper 840 receives a signal from the C element. In one embodiment, the Keeper includes two inverters connected in a feedback loop. The three inverters 850, 870, and 880 invert its respective digital signal. The inverter 850 receives the output signal from Latch LB 815 and converts the signal into SO. The inverter 870 inverts the TEST signal at one of the C element 830 input ports. Inverter 880 inverts the CLK signal for input into the Latch PH2 820 and Latch LA 810.

The multiplexer 860 receives the input signal D and the output signal from Latch PH1 825. The multiplexer 860 is enabled by a signal CAPTURE. The multiplexer 860 send its output signal to Latch LA 810.

The OR gate 890 receives a clock signal SCB and the clock signal CLK. The OR gate transmits its output signal to the Latch LB 815.

The scan latches store redundant copies of data in functional mode. The C-element performs the task of error isolation. The TEST signal activates the C element in the functional mode only. The output of the LB and PH1 are connected to the C element such that if they are identical, the output is passed to the next block else the keeper helps retain the previous state of the flip flop.

Figure 9:
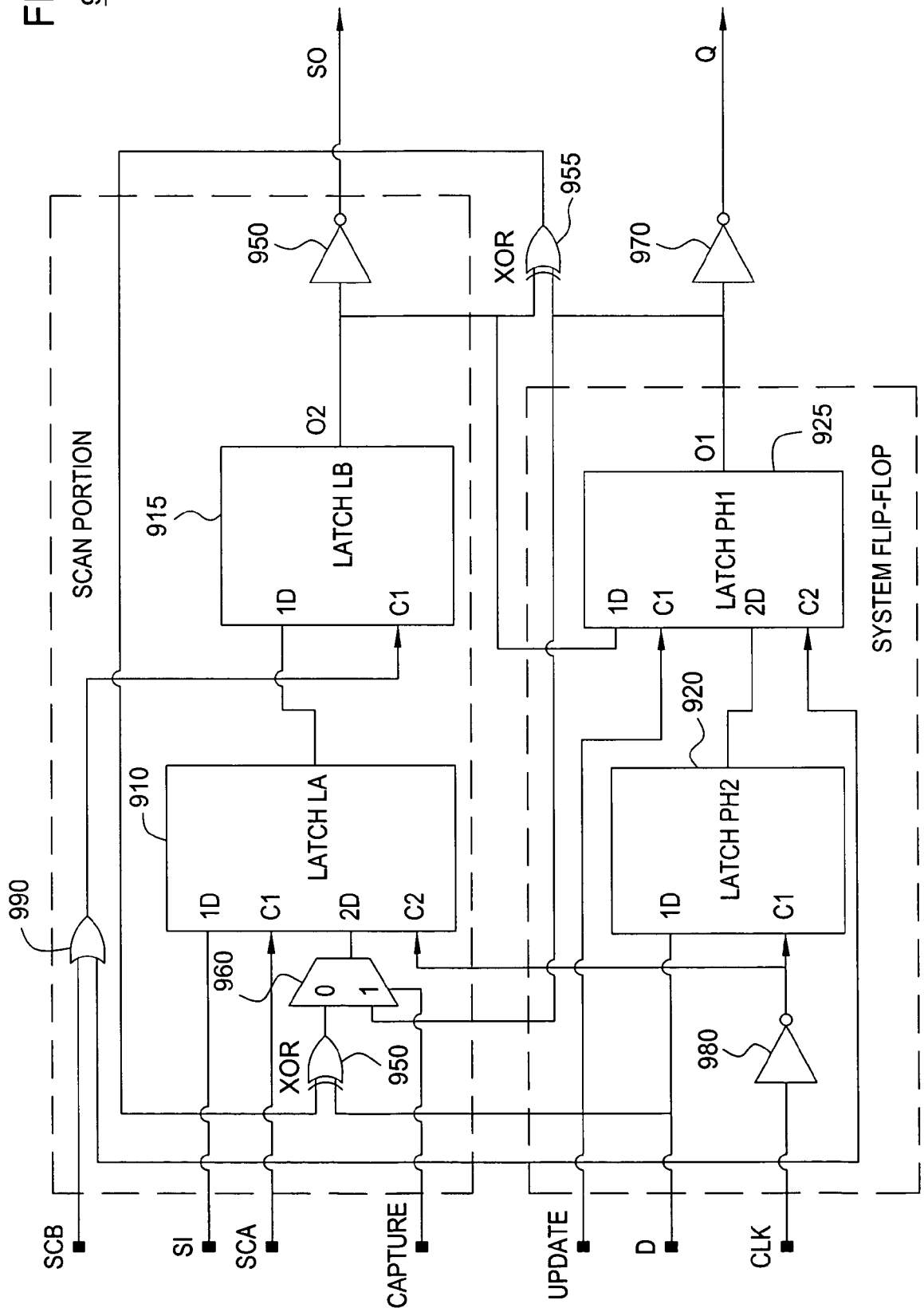
FIG. 9 depicts a high-level block diagram of an error trapping flip flop according to one embodiment of the invention.

FIG. 9 depicts a high-level block diagram of an error trapping flip flop according to one embodiment of the invention. The system latches are tested. The scheme is similar to the Test mode in the basic scan flip flop.

The flip flop architecture 900 includes a Latch LA 910, a Latch LB 915, a Latch PH2 920, a Latch PH1 925, two XOR gates 950, 955, a multiplexer 960, three inverters 950, 970, 980 and an OR gate 990.

The Latch LA 910 receives signal SI, a clock SCA, a signal from the multiplexer 960 and an inverse clock signal CLK from the inverter 980. The Latch LA 910 transmits an output signal to Latch LB 915.

Latch LB 915 receives the output signal from Latch LA 910 and a clock signal from the OR gate 990. Latch LB 915 transmits an output signal to the inverter 950, which generates SO. Latch LB 915 is also sent to Latch PH1 925 and XOR gate 955.

The Latch PH2 920 receives the signal D and an inverse CLK from the inverter 980. The Latch PH2 transmits its output signal to Latch PH1 925.

The Latch PH1 925 receives the signal that is the output of Latch LB 915 and the signal that is the output of Latch PH2 920. Latch PH1 925 also receives signals UPDATE and CLK. The Latch PH1 925 has one output signal that is also transmitted to multiplexer 960 and XOR gate 955.

The XOR gate 955 receives the output signal of Latch PH1 925 and Latch LB 915 and transmits its output signal to XOR gate 950.

The XOR gate 950 receives the output of XOR gate 955 and the input signal D. The XOR gate 250 transmits its output signal to multiplexer 960.

The multiplexer 960 receives the output signal from Latch PH1 925 and the output signal from XOR gate 950. The multiplexer 960 is enabled by a signal CAPTURE. The multiplexer 960 transmits its output signal to Latch LA 910.

The OR gate 990 receives a clock signal SCB and the clock signal CLK. The OR gate 990 transmits its output signal to Latch LB 915.

The inverter 950 at the output of latch LB 915, generates the output signal SO. The inverter 970 at the output of latch PH1 925 generates OUTPUT signal Q. The inverter 980 receives the CLK signal and transmits the inverted CLK to Latch PH2 920 and Latch LA 910.

In the functional mode, the scan latches are loaded with identical copies of the incoming data (i.e., no error) or the complement of the incoming data (error). The output signal of latches LB and PH1 are evaluated by the XOR gate and in case of a mismatch, an error signal is generated. This output signal when XORed with the incoming Data signal (D) stores the complemented value of the data in the scan latches (i.e., only in case of an error) and continues to do so until a corrective action is taken (i.e., usually in the form of a re-execution) at system recovery or until the occurrence of another soft error which is a rare possibility.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A soft error tolerant register, comprising:
   a scan flip flop comprising a scan portion and a system flip flop;
   a hold flip flop comprising a hold master flip flop and a hold slave flip flop; and
   a majority voter for generating a corrected data signal in response to a majority logic level as indicated by a respective data signal from each of the scan portion, system flip flop and hold flip flop;
   wherein functional data is simultaneously registered at the scan portion, system flip flop and hold flip flop.

2. The register of claim 1, wherein the register is tolerant of soft error.

3. The register of claim 1, wherein the register is adapted for basic scan testing for structural faults.

4. The register of claim 1, wherein the register is adapted for delay testing.

5. The register of claim 1, wherein the register detects and corrects soft error in real time.

6. The register of claim 1, wherein the corrected data signal is the signal represented by the majority of the three data signals.

7. The register of claim 1, wherein the register comprises six latches.

8. An apparatus comprising:
   a basic scan flip flop comprising a scan portion and a system flip flop;
   a hold flip flop comprising a hold master flip flop and a hold slave flip flop; and
   means for generating a corrected data signal in response to a majority logic level as indicated by a respective data signal from each of the scan portion, system flip flop and hold flip flop, wherein functional data is simultaneously registered at the scan portion, system flip flop and hold flip flop.

9. The apparatus of claim 8, wherein the apparatus is tolerant of soft error.

10. The apparatus of claim 8, further comprising means for basic scan testing for structural faults.

11. The apparatus of claim 8, further comprising means for delay testing.

12. The apparatus of claim 8, further comprising means for detecting and correcting soft error in real time.

13. The apparatus of claim 8, wherein the corrected data signal is the signal represented by the majority of the three data signals.

14. The apparatus of claim 8, wherein the apparatus comprises six latches.

* * * * *